United States Patent [19]

Schafft

[11] 4,047,060

[45] Sept. 6, 1977

[54] ACOUSTIC TRANSDUCER WITH ELASTOMERIC COUPLING

[75] Inventor: Hugo Willy Schafft, Des Plaines, Ill.

[73] Assignee: Motorola, Inc., Schaumburg, Ill.

[21] Appl. No.: 655,367

[22] Filed: Feb. 5, 1976

Related U.S. Application Data

[63] Continuation-in-part of Ser. No. 178,102, Sept. 7, 1971, abandoned, and Ser. No. 405,208, Oct. 10, 1973, abandoned, and Ser. No. 532,114, Dec. 12, 1973, abandoned.

[51] Int. Cl.² .................................... H01L 41/04
[52] U.S. Cl. ................................. 310/322; 310/369
[58] Field of Search .................. 310/8.1, 8.2, 8.3, 8.5, 310/8.6, 9.1, 9.4

[56] References Cited

U.S. PATENT DOCUMENTS

| 2,387,108 | 10/1945 | Arndt et al. | 310/8.6 X |
| 2,602,327 | 7/1952 | Bond | 310/8.7 |
| 3,321,648 | 5/1967 | Kolm | 310/8.2 |

*Primary Examiner*—Mark O. Budd
*Attorney, Agent, or Firm*—James W. Gillman; Eugene A. Parsons; Victor Myer

[57] ABSTRACT

A piezoelectric disc having opposed major surfaces with electrodes affixed thereto bonded in generally parallel overlying relationship to a piezoelectrically inactive acoustic radiation member by means of an elastomeric interlayer, which elastomeric material is characterized by having a shear modulus which varies directly with the frequency of stresses applied to said elastomeric material.

3 Claims, 6 Drawing Figures

ACOUSTIC TRANSDUCER WITH ELASTOMERIC COUPLING

CROSS REFERENCE TO RELATED APPLICATIONS

This application is a continuation in part of an application entitled "Improved Transducer", Ser. No. 178,102, originally filed Sept. 7, 1971; continuation application of the same title, Ser. No. 405,208, filed Oct. 10, 1973; and continuation application of the same title, Ser. No. 532,114, filed Dec. 12, 1973; each now abandoned.

BACKGROUND OF THE INVENTION

The present invention pertains specifically to piezoelectric acoustic transducers, of either the single or multiple element type, wherein a ceramic piezoelectric disc is affixed in parallel overlying relationship to a piezoelectrically inactive acoustic radiation member so that electrical energization of the piezoelectric disc, with the consequent expansion and contraction thereof, will cause the acoustic radiation member to bend and produce sound pressure waves. It also may be utilized in piezoelectric transducers operating in a compressional mode.

In the bender type of piezoelectric transducer it is desirable to couple all, or as much as possible, of the stress created by energization of the piezoelectric disc to the inactive disc. To accomplish this the piezoelectrically active and inactive discs are generally rigidly attached together over the entire adjacent surfaces. Rigidly attaching the piezoelectric disc to the piezoelectrically inactive disc, which may be metal or the like, presents severe problems because of differences in thermal coefficients of expansion between ceramic and metal. The different thermal coefficients of expansion between the ceramic disc and the metal disc produce stresses in the ceramic disc which prevent efficient operation of the transducer and can, in severe cases, cause the ceramic disc to fracture. Further, static or slowly varying stresses in piezoelectric crystals, and especially soft ceramic compositions, cause a gradual permanent depoling of the material.

DESCRIPTION OF THE PRIOR ART

In general, prior art piezoelectric transducers operating in the bender mode are constructed as described above and care is taken during operation not to exceed predetermined temperatures which will cause a substantial reduction in efficiency.

One method of alleviating the problem caused by different coefficients of thermal expansion in ceramic transducers operating in the compressional mode is described in U.S. Pat. No. 3,441,754, entitled "Base Mounted Piezoelectric Transducer Assembly Having Intermediate Stress Absorbing Member". In the structure disclosed therein an intermediate layer of material, having a coefficient of thermal expansion the same as the ceramic disc but a higher tensile strength, is positioned between the ceramic disc and the metal disc. This intermediate layer is rigidly affixed to the ceramic disc and the metal disc by means of epoxy resin or the like.

While this structure reduces the stress applied directly to the ceramic disc, a rigid bond between two materials having incompatible coefficients of thermal expansion is still formed. Thus, varying temperatures will produce a stress at the junction of the intermediate layer and the metal disc, which stress will produce bending of the transducer, thereby causing the operation thereof to be unreliable.

SUMMARY OF THE INVENTION

The present invention pertains to an improved acoustic transducer including a piezoelectric disc and piezoelectrically inactive acoustic radiation member having an elastomeric interlayer fixedly sandwiched therebetween, which elastomeric is characterized by having a shear modulus which varies directly with the frequency of stresses applied thereto.

It is an object of the present invention to provide an improved acoustic transducer wherein static or slowly varying stresses, such as those caused by varying temperatures and the like, are greatly reduced or eliminated.

It is a further object of the present invention to provide an improved acoustic transducer with an elastomeric interlayer having a shear modulus which varies directly with the frequency of stresses applied thereto.

It is a further object of the present invention to provide an improved acoustic transducer including an elastomeric interlayer sandwiched between a piezoelectric disc and piezoelectrically inactive acoustic radiation member, which elastomeric interlayer also acts to fixedly bond the discs together.

These and other objects of this invention will become apparent to those skilled in the art upon consideration of the accompanying specification, claims and drawings.

BRIEF DESCRIPTION OF THE DRAWINGS

Referring to the drawings.

DESCRIPTION OF THE PREFERRED EMBODIMENT

Figure 1:
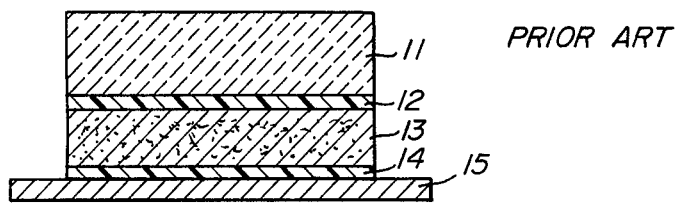
FIG. 1 is a sectional view of a prior art piezoelectric transducer, portions thereof removed.

Referring to FIG. 1, a prior art piezoelectric transducer is illustrated in cross section, which transducer is in reality a compressional type. The prior art transducer includes a piezoelectric element 11 bonded to an intermediate stress absorbing element 13 by means of a layer of epoxy resin 12. The element 13 is in turn bonded to a base 15 by means of a second layer of epoxy resin 14. The piezoelectric element 11 is generally formed of a polycrystalline material commonly referred to as ceramic and the element 15 is generally formed of metal.

In the above-described prior art transducer, the intermediate element 13 is composed of a material which has substantially the same coefficient of thermoconductivity and the same coefficient of thermal expansion as the ceramic of which the piezoelectric transducer element 11 is composed. Further, the intermediate element 13 is a boardlike member formed of layers of cloth impregnated with a mixture of epoxy resin and finely divided alumina or glass with a high tensile strength as compared to the ceramic material of the element 11. However, because the element 13 and the base 15 have differing or incompatible coefficients of thermal expansion and because the element 13 and base 15 are rigidly joined by the epoxy layer 14, substantial stresses are formed in the overall unit which greatly hamper the operation thereof.

Figure 5:
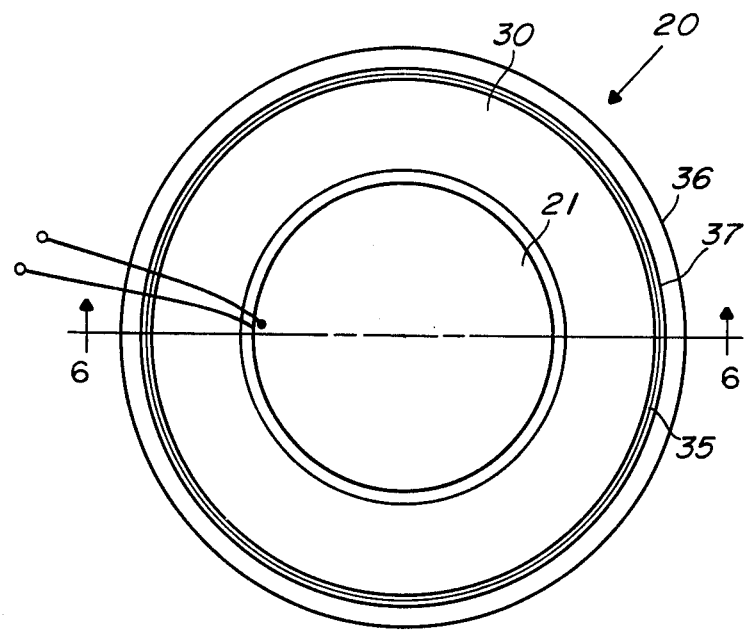
FIG. 5 is a plan view of an improved piezoelectric acoustic transducer.
Figure 6:
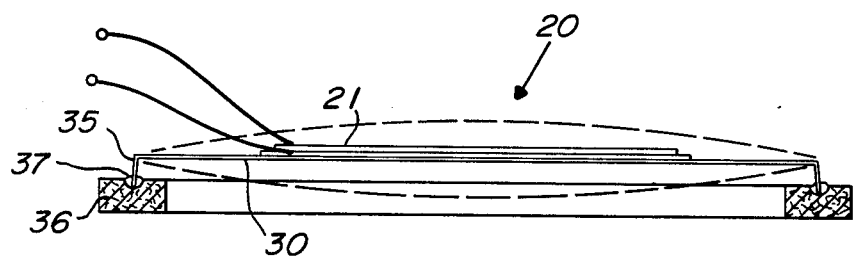
FIG. 6 is a sectional view as seen from the line 6—6 in FIG. 5.

Referring specifically to FIGS. 5 and 6, an improved piezoelectric acoustic transducer or speaker, generally designated 20, is illustrated. The transducer includes a piezoelectric driver 21 fixedly attached to an acoustic radiating member of diaphragm 30. The diaphragm 30 is generally circular in shape with the circularly shaped driver 21 centrally located thereon, a flexible hinge 35, which may be integrally formed with the diaphragm 30 or may be a plurality of generally axially extending fingers attached thereto, fixedly attaches the outer periphery of the diaphragm 30 to a fixed annular mounting member 36. The outwardly extending edge, or edges, of the flexible hinge 35 is fixedly attached in a groove in the mounting member by means of epoxy or the like, designated by the number 37. The flexible hinge 35 should be made of some relatively stiff material which will allow the diaphragm 30 to flex as illustrated by the dotted lines in FIG. 6, but which will return to its original position when the speaker is inactive. The diaphragm 30 and the flexible hinge 35 may be constructed of various light metals, fiberous materials, etc.

Figure 2:
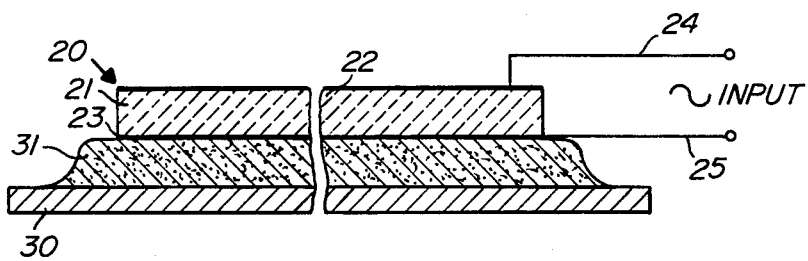
FIG. 2 is a greatly enlarged sectional view of the driving portion of an improved piezoelectric acoustic transducer embodying the present invention.

FIG. 2 is an enlarged view of a portion of the transducer. The transducer 20 includes the piezoelectric driver or element 21 having opposed major surfaces with electrodes 22 and 23 affixed thereto in the usual manner. The piezoelectric element 21 may be formed from any of the ceramic materials and the like well known to those skilled in the art and further may include one or more discs fixedly attached together for parallel operation. The electrodes 22 and 23 have input leads 24 and 25 attached thereto, respectively, for receiving an input signal thereon.

Figure 4:
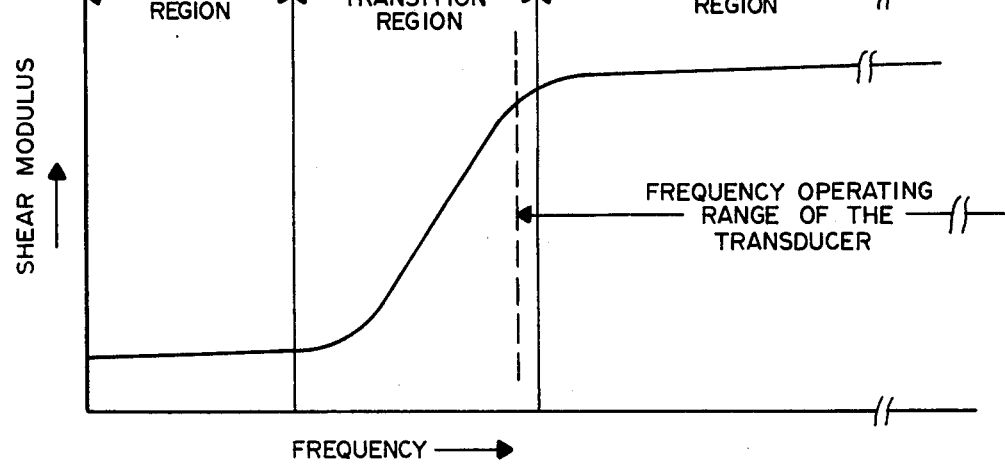
FIG. 4 is a graphic presentation illustrating typical variations of shear modulus with frequency for plastic elastomers.

The diaphragm 30, a piezoelectrically inactive element which may be formed of metal or other rigid material, is affixed to the major surface of the element 21 having the electrode 23 thereon by means of an interlayer 31 of elastomeric material. Elastomers or elastomeric materials generally have a frequency dependent shear modulus which varies directly with the frequency of stresses applied to said elastomer, i.e., the shear modulus increases with the frequency of stresses applied thereto approximately as illustrated in FIG. 4. At static or slowly occurring stresses, caused by differences in thermal expansion coefficients, etc., the shear modulus of the elastomer is sufficiently low (see the rubbery region in FIG. 4) to produce substantially no stresses in the element 21. However, when relatively high frequency (generally in the audio frequency range) dynamic stresses are produced by energizing the element 21 through the input leads 24 and 25, the shear modulus of the interlayer 31 is increased sufficiently to cause the interlayer 31 to act similar to a metallic interlayer (see the glassy region in FIG. 4) and transmit all stresses from the element 21 to the diaphragm 30.

In the embodiment illustrated in FIG. 2, an elastomer is utilized for the interlayer 31 which, in addition to the above-described operation, also serves to bond the element 21 to the diaphragm 30 without the use of additional bonding agents. Through experiments it has been found that the thickness of the interlayer 31 is preferably approximately the thickness of the element 21. Typical examples of an elastomer characterized by having a shear modulus which varies directly with the frequency of stresses applied thereto and which will provide a reliable bond between the piezoelectric element 21 and the diaphragm 30 are polyvinyl-butyral, polyvinyl-acetate and the like. In general, referring to FIG. 4, it is desirable to utilize material for the interlayer 31 wherein the transition from the rubbery region to the glassy region is a large step and occurs at a relatively low frequency, or below the operating frequency of the transducer 20. A transducer, utilizing polyvinyl-butyral as the elastomer, is constructed by subjecting a sandwich composed of a desired ceramic element 21, a polyvinyl-butyral interlayer 31 and a metal plate 30 to a temperature of approximately 140° C for approximately 10 minutes.

Figure 3:
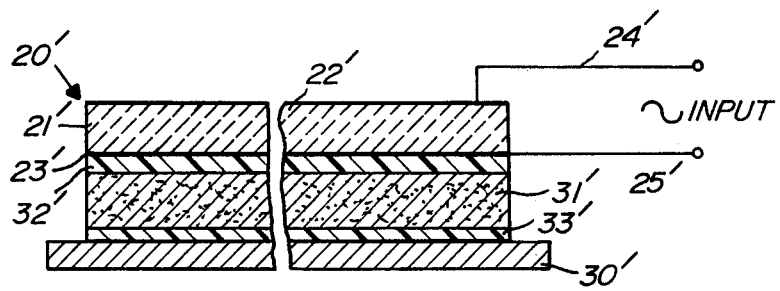
FIG. 3 is a view similar to FIG. 2 of another embodiment.

Referring to FIG. 3, a portion of another embodiment of a piezoelectric transducer is illustrated wherein similar parts are designated with similar numbers having a prime added to indicate a different embodiment. A transducer 20' includes a piezoelectric element 21' having electrodes 22' and 23' on opposed major surfaces thereof and input lead 24' and 25' affixed thereto, respectively. The transducer 20' further includes a diaphragm 30' and an elastomeric interlayer 31' sandwiched between the diaphragm 30' and the piezoelectric element 21'. An adhesive or bonding agent is placed in layers between the element 21' and the interlayer 31' and between the interlayer 31' and the diaphragm 30' respectively. The layers or films of bonding agent 32' and 33' should maintain the structure rigidly assembled. The elastomeric interlayer 31' is characterized by having a shear modulus which varies directly with the frequency of stresses applied thereto, as described above. In the embodiment illustrated in FIG. 3 the elastomeric interlayer 31' is not utilized to bond the element 21' to the diaphragm 30' and, therefore, any elastomer characterized by having a shear modulus which varies directly with the frequency of stresses applied thereto can be utilized.

Thus, an improved acoustic transducer is disclosed wherein an elastomeric interlayer is sandwiched between the piezoelectric element and the diaphragm or acoustic radiating member so that an optimum piezoelectric acoustic transducer can be constructed wherein little or no stress will be produced in the piezoelectric element because of differences in the coefficients of thermal expansion between the various elements. Further, because the elastomeric interlayer can be utilized as the bonding agent between the piezoelectric element and the diaphragm, the construction of the transducers is greatly simplified.

While I have shown and described specific embodiments of this invention, further modifications and improvements will occur to those skilled in the art. I desire it to be understood, therefore, that this invention is not limited to the particular form shown and I intend in the appended claims to cover all modifications which do not depart from the spirit and scope of this invention.

I claim:
1. A piezoelectric acoustic transducer comprising:
   a. a generally circular, disc shaped piezoelectric element having opposed major surfaces with electrodes affixed thereto;
   b. a generally circular diaphragm formed of piezoelectrically inactive material having a different thermal coefficient of expansion from said piezoelectric element, said diaphragm having opposed major surfaces one of which defines an area at least coextensive with one of the major surfaces of said piezoelectric element;

c. an elastomeric interlayer having one surface affixed to said one major surface of said piezoelectric element and an opposed surface affixed to said one coextensive major surface of said diaphragm, said elastomeric interlayer being formed of material having a shear modulus which varies directly with the frequency of stress applied thereto and said material being further characterized by mechanically coupling said piezoelectric element to said diaphragm at acoustic frequencies within the operating range of the transducer and decoupling said piezoelectric element from said diaphragm at lower frequencies;

d. a mounting member; and e. flexible hinge means fixedly attaching said diaphragm to said mounting member for axial flexing movements at an acoustic rate.

2. A piezoelectric acoustic transducer as claimed in claim 1 wherein the elastomeric interlayer is approximately the same thickness as the piezoelectric element.

3. A piezoelectric acoustic transducer as claimed in claim 1 wherein the diaphragm is generally flat and the mounting member is generally annular shaped with the diaphragm mounted generally coaxial with the mounting member.

* * * * *